(12) United States Patent
Seto et al.

(10) Patent No.: US 10,128,276 B2
(45) Date of Patent: Nov. 13, 2018

(54) DISPLAY PANEL

(71) Applicant: Panasonic Liquid Crystal Display Co., Ltd., Himeji-shi, Hyogo (JP)

(72) Inventors: Nobuyuki Seto, Osaka (JP); Nagatoshi Kurahashi, Hyogo (JP); Daisuke Kanemoto, Hyogo (JP); Masafumi Hirata, Hyogo (JP); Norimichi Shirai, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 15/819,682

(22) Filed: Nov. 21, 2017

(65) Prior Publication Data

US 2018/0122828 A1 May 3, 2018

Related U.S. Application Data

(63) Continuation of application No. PCT/JP2016/001069, filed on Feb. 26, 2016.

(30) Foreign Application Priority Data

May 21, 2015 (JP) ................................. 2015-103738

(51) Int. Cl.
*H01L 27/12* (2006.01)
*G02F 1/1368* (2006.01)
*G02F 1/1362* (2006.01)
*H01L 27/32* (2006.01)

(52) U.S. Cl.
CPC .......... *H01L 27/124* (2013.01); *G02F 1/1368* (2013.01); *G02F 1/136286* (2013.01);
(Continued)

(58) Field of Classification Search
CPC ............. H01L 27/3272; H01L 27/3244; H01L 27/3248; H01L 27/3262; H01L 27/3211;
(Continued)

(56) References Cited

U.S. PATENT DOCUMENTS

2004/0046920 A1* 3/2004 Hayata .................. G02F 1/1345
349/149
2005/0157243 A1 7/2005 Hayata et al.
(Continued)

FOREIGN PATENT DOCUMENTS

JP 2002-098999 4/2002
JP 2003-043980 2/2003
(Continued)

*Primary Examiner* — Thanh T Nguyen
(74) *Attorney, Agent, or Firm* — Hamre, Schumann, Mueller & Larson, P.C.

(57) ABSTRACT

A display panel includes selection transistors connected to ends of gate lines, first inspection transistors connected to data lines, second inspection transistors provided in each group, a first conductive electrode of each of second inspection transistors being connected to the control electrode of each of the selection transistors, inspection selection signal supply wirings connected to a second conductive electrode of each of second inspection transistors, each of inspection selection signal supply wirings supplying a control signal for turning on or off the second inspection transistor; and an inspection control signal supply wiring connected to a control electrode of each of first inspection transistors and a control electrode of each of the second inspection transistors, the inspection control signal supply wiring supplying a control signal for turning on or off the first and second inspection transistors. The selection transistors and the second inspection transistors are arranged in a display region.

9 Claims, 8 Drawing Sheets

(52) U.S. Cl.
CPC .............. *H01L 27/1251* (2013.01); *G02F 2001/136254* (2013.01); *H01L 27/3272* (2013.01)

(58) Field of Classification Search
CPC ........... H01L 29/41733; H01L 29/4908; H01L 29/42384; H01L 29/78678; H01L 29/78669; H01L 29/78666; H01L 29/78675; H01L 27/124; H01L 27/1251; H01L 27/12; G02F 1/1368; G02F 1/136286; G02F 2001/136254; G02F 1/1362
See application file for complete search history.

(56) References Cited

U.S. PATENT DOCUMENTS

| | | |
|---|---|---|
| 2007/0252830 A1 | 11/2007 | Hayata et al. |
| 2011/0127536 A1* | 6/2011 | Yoshida ................ G02F 1/1362 257/59 |
| 2011/0141384 A1 | 6/2011 | Hayata et al. |
| 2011/0205480 A1 | 8/2011 | Hayata et al. |
| 2013/0099816 A1* | 4/2013 | Kawase ................ G09G 3/006 324/762.03 |
| 2013/0299850 A1 | 11/2013 | Yoshida et al. |
| 2015/0185513 A1* | 7/2015 | Wu .................... G02F 1/134363 257/72 |
| 2017/0092182 A1* | 3/2017 | Fukami ................ G09G 3/2085 |

FOREIGN PATENT DOCUMENTS

| | | |
|---|---|---|
| JP | 2004-101863 | 4/2004 |
| JP | 2007-140378 | 6/2007 |
| JP | 2010-243526 | 10/2010 |
| JP | 2010-286617 | 12/2010 |
| JP | 2011-123162 | 6/2011 |
| JP | 2014-059567 | 4/2014 |
| WO | 2010/010750 | 1/2010 |
| WO | 2012/002199 | 1/2012 |

* cited by examiner

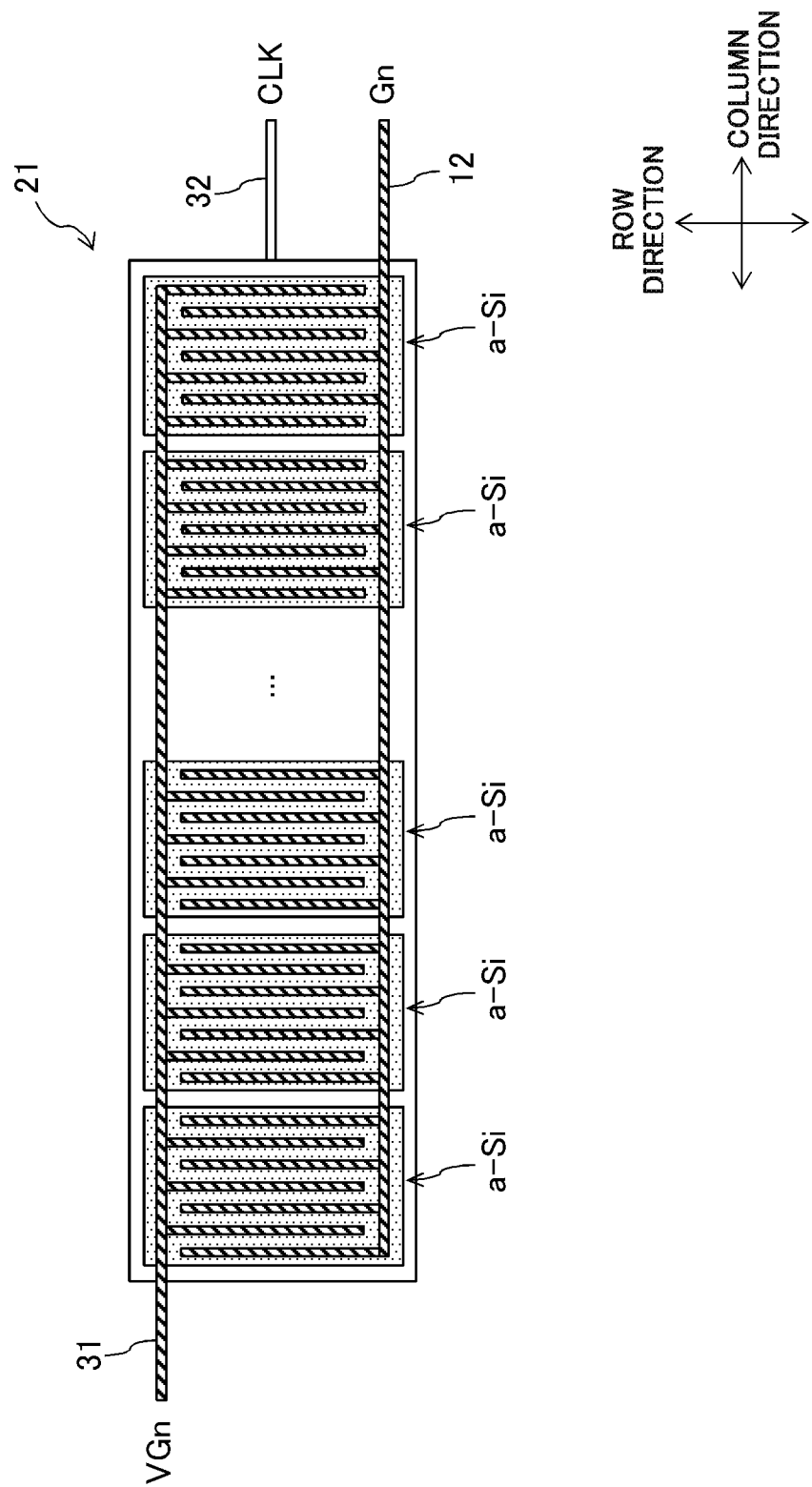

DISPLAY PANEL

CROSS-REFERENCE TO RELATED APPLICATION

This application is a bypass continuation of international patent application PCT/JP2016/001069, filed Feb. 26, 2016 designating the United States of America. Priority is claimed based on a Japanese patent application JP2015-103738, filed May 21, 2015. The entire disclosures of these international and Japanese patent applications are incorporated herein by reference in their entirety.

TECHNICAL FIELD

The present disclosure relates to a display panel.

BACKGROUND

Conventionally, there has been proposed a display panel in which a source driver IC and a gate driver IC are disposed in one identical side in order to narrow a frame of the display panel. For example, a prior art (for example, see, Japanese Unexamined Patent Application Publication No. 2004-101863) discloses a display panel including a configuration for detecting a defect of a wiring such as a gate line and a data line without enlarging a frame region.

In the liquid crystal display device disclosed in the prior art, an inspection switch and a gate driver are electrically insulated from each other while the inspection switch is disposed below the gate driver.

In the recent display panel, with attainment of further high definition, a number of various wirings increases and wiring disposition becomes complicated compared with the conventional display panel. For this reason, the technology of the prior art hardly prevents the enlargement of the frame region. Additionally, inspection wirings disposed in the frame region come into contact with each other, which results in a risk of hardly performing an accurate inspection.

The present disclosure has been made in view of the above problems and an object thereof is to provide a display panel that can surely be inspected while an area of the frame region is reduced in the display panel in which an inspection transistor and an inspection wiring are disposed in the frame region.

SUMMARY

In one general aspect, the instant application describes a display panel including a plurality of data lines extending in a row direction, a plurality of gate lines extending in a column direction, each of the plurality of gate lines adjacent in the row direction being grouped into one group, a plurality of selection transistors connected to ends of the plurality of gate lines, respectively, a plurality of selection signal supply wirings provided in each group, each of the plurality of selection signal supply wirings supplying a control signal for turning on or off the selection transistor to a control electrode of each of the plurality of the selection transistors corresponding to the group, a plurality of gate signal supply wirings that sequentially supply a gate signal to the plurality of gate lines included in the group, a plurality of first inspection transistors connected to the plurality of data lines, respectively, a plurality of second inspection transistors provided in each group, a first conductive electrode of each of the plurality of second inspection transistors being connected to the control electrode of each of the plurality of the selection transistors corresponding to the group, a plurality of inspection selection signal supply wirings connected to a second conductive electrode of each of the plurality of second inspection transistors, each of the plurality of inspection selection signal supply wirings supplying a control signal for turning on or off the second inspection transistor; and an inspection control signal supply wiring connected to a control electrode of each of the plurality of first inspection transistors and a control electrode of each of the plurality of second inspection transistors, the inspection control signal supply wiring supplying a control signal for turning on or off the first and second inspection transistors. The plurality of selection transistors and the plurality of second inspection transistors are arranged in the row direction on one side in a display region.

The above general aspect may include one or more of the following features.

Each of the plurality of second inspection transistors may be disposed between the two selection transistors, which are adjacent to each other in the row direction and provided corresponding to the two groups adjacent to each other in the row direction.

The adjacent second inspection transistors may be arranged in the row direction, and disposed between the two selection transistors, which are adjacent to each other in the row direction and provided corresponding to the two groups adjacent to each other in the row direction.

The adjacent second inspection transistors may be arranged in the column direction, and disposed between the two selection transistors, which are adjacent to each other in the row direction and provided corresponding to the two groups adjacent to each other in the row direction.

The semiconductor layer may constitute a channel portion of each of the plurality of selection transistors and the plurality of second inspection transistors may be divided into a plurality of pieces in the column direction.

The display panel may further comprise a plurality of inspection gate signal supply wirings that supply an inspection gate signal to the plurality of gate lines, and a plurality of third inspection transistors. In each third inspection transistor, a first conductive electrode may be connected to the inspection gate signal supply wiring, a second conductive electrode may be electrically connected to the selection transistor, and a control electrode may be connected to the inspection control signal supply wiring.

The plurality of inspection selection signal supply wirings may include a first inspection selection signal supply wiring and a second inspection selection signal supply wiring. The first inspection selection signal supply wiring may be electrically connected to the second conductive electrode of the second inspection transistor provided corresponding to an odd-numbered group. The second inspection selection signal supply wiring may be electrically connected to the second conductive electrode of the second inspection transistor provided corresponding to an even-numbered group.

The plurality of inspection gate signal supply wirings may include a first inspection gate signal supply wiring and a second inspection gate signal supply wiring. The first inspection gate signal supply wiring may be electrically connected to a plurality of odd-numbered gate lines, and the second inspection gate signal supply wiring may be electrically connected to a plurality of even-numbered gate lines.

The plurality of gate lines may be electrically connected to each of the gate signal supply wirings, and the plurality of gate lines may be electrically connected to the gate signal supply wirings different from each other in each group.

In the display device of the present disclosure, the display panel can surely be inspected while the area of the frame region is reduced in the display panel in which the inspection transistor and the inspection wiring are disposed in the frame region.

BRIEF DESCRIPTION OF THE DRAWINGS

FIG. 8 is a plan view illustrating a specific configuration of selection transistor.

DETAILED DESCRIPTION

An embodiment of the present application is described below with reference to the drawings.

An exemplary embodiment of the present disclosure will be described below with reference to the drawings. In the exemplary embodiment of the present disclosure, a liquid crystal display device is cited as an example of the display device. However, the present disclosure is not limited to the liquid crystal display device. For example, an organic EL display device and the like may be used as the display panel. In the exemplary embodiment of the present disclosure, a COG (Chip On Glass) type liquid crystal display device is cited as an example. However, the present disclosure is not limited to the COG type liquid crystal display device. For example, the liquid crystal display device may be a COF (Chip On Film) type or TCP (Tape Carrier Package) type display device.

Figure 1:
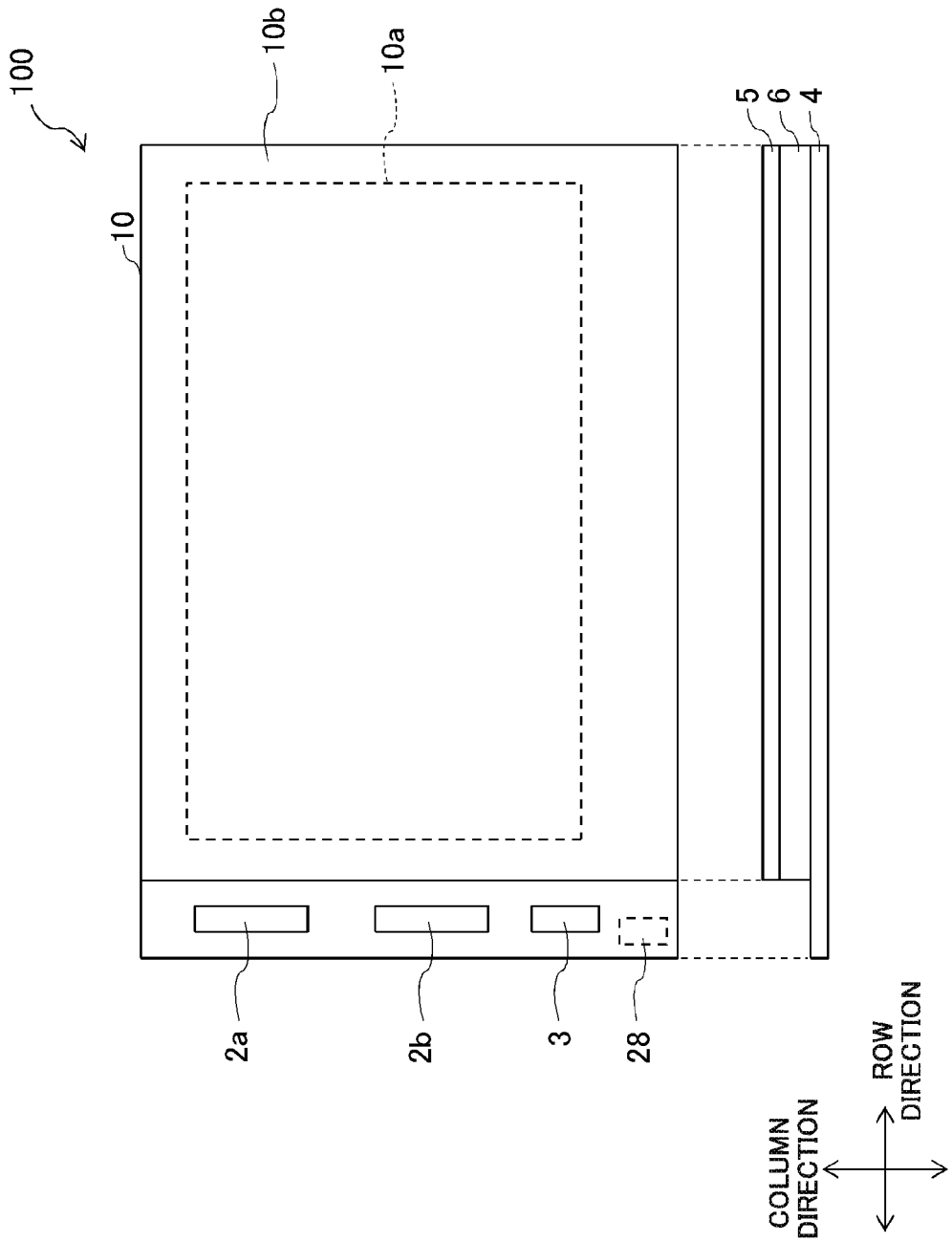
FIG. 1 is plan and side views illustrating a schematic configuration of a liquid crystal display device according to an exemplary embodiment.

FIG. 1 is plan and side views illustrating a schematic configuration of a liquid crystal display device according to an exemplary embodiment. Liquid crystal display device 100 includes display panel 10, source driver ICs 2a, 2b, gate driver IC 3, and a backlight device (not illustrated). Display panel 10 includes thin film transistor substrate 4 (TFT substrate), color filter substrate 5 (CF substrate), and a liquid crystal layer 6 sandwiched between TFT substrate 4 and CF substrate 5. Source driver ICs 2a, 2b and gate driver IC 3 are directly mounted on a glass substrate constituting TFT substrate 4. Source driver ICs 2a, 2b and gate driver IC 3 are disposed in line along one side of display panel 10. There is no limitation to numbers of source driver ICs and gate driver ICs. Display panel 10 includes display region 10a where an image is displayed, and frame region 10b around display region 10a.

Inspection signal input pad 28 is provided in a peripheral portion (in FIG. 1, a lower left end of display panel 10) of display panel 10. An inspection device (not illustrated) used in inspection of display panel 10 is connected to inspection signal input pad 28. The inspection device generates and outputs various inspection signals. Details of inspection signal input pad 28 will be described later. In the following description, each pad included in inspection signal input pad 28 and the inspection signal input to each pad are designated by the identical numeral as needed.

Figure 2:
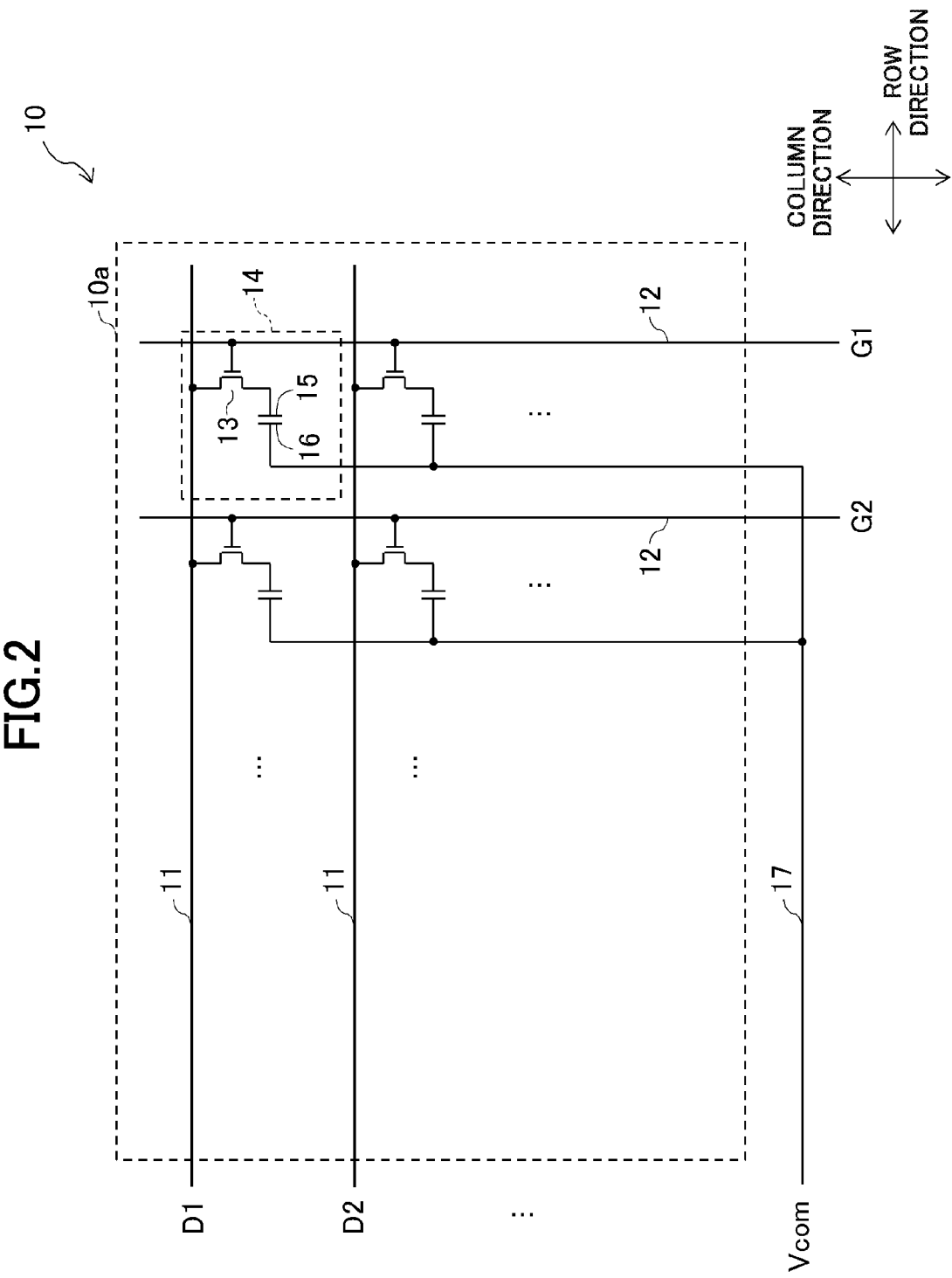
FIG. 2 is a plan view illustrating a schematic configuration of the display region of display panel according to the exemplary embodiment.

FIG. 2 is a plan view illustrating a schematic configuration of display region 10a of display panel 10. A plurality of data lines 11 extending in a row direction and a plurality of gate lines 12 extending in a column direction are provided in display panel 10. Thin film transistor 13 (TFT) is provided in an intersection of each data line 11 and each gate line 12. Each data line 11 is electrically connected to the corresponding source driver IC (see FIG. 1), and each gate line 12 is electrically connected to the corresponding gate driver IC (see FIG. 1). Numeral D1 designates first data line 11 disposed at an endmost portion in the column direction, and numeral D2 designates second data line 11 adjacent to first data line 11 in the column direction. Numeral G1 designates first gate line 12 disposed at an endmost portion in the row direction, and numeral G2 designates second gate line 12 adjacent to second gate line 12 in the row direction.

In display panel 10, a plurality of pixels 14 are arranged into a matrix shape (the row direction and the column direction) corresponding to the intersections of data lines 11 and gate lines 12. A plurality of pixel electrodes 15 disposed in each pixel 14 and common electrode 16 common to a plurality of pixels 14 are provided in TFT substrate 4. Common electrode 16 may be provided in CF substrate 5.

A data signal (data voltage) is supplied from the corresponding source driver IC to each data line 11. A gate signal (gate-on voltage, gate-off voltage) is supplied from the gate driver IC to each gate line 12. Common voltage Vcom is supplied from a common driver (not illustrated) to common electrode 16 through common wiring 17. When an on-voltage (gate-on voltage) of the gate signal is supplied to gate line 12, thin film transistor 13 connected to gate line 12 is turned on, and the data voltage is supplied to pixel electrode 15 through data line 11 connected to thin film transistor 13. An electric field is generated by a difference between the data voltage supplied to pixel electrode 15 and common voltage Vcom supplied to common electrode 16. The liquid crystal is driven by the electric field, and transmittance of light emitted from a backlight is controlled, and thus displaying an image. For performing color display, a desired data voltage is supplied to data line 11 connected to pixel electrode 15 of pixel 14 corresponding to each of red, green, and blue, which are formed by a stripe color filter.

Figure 3:
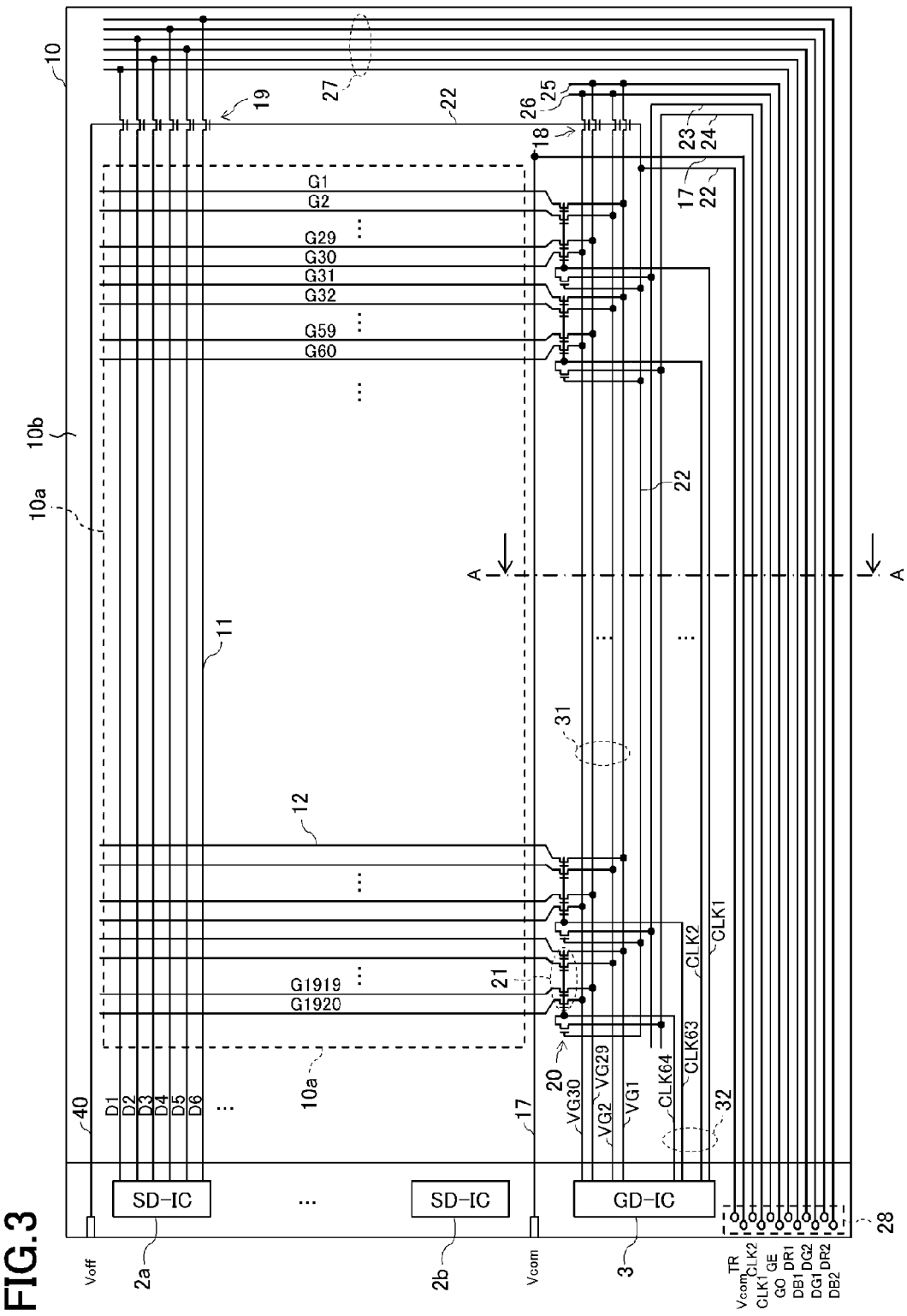
FIG. 3 is a plan view illustrating the detailed configuration of the display panel according to the exemplary embodiment.

FIG. 3 is a plan view illustrating the detailed configuration of display panel 10. Source driver ICs 2a, 2b (SD-IC) to each of which one end of each data line 11 is connected, gate driver IC 3 (GD-IC) to which one end of each gate line 12 is electrically connected, and terminal Vcom to which one end of common wiring 17 is connected are disposed in the peripheral portion (in FIG. 3, on the left side) of frame region 10b of display panel 10. Gate line 12 is connected to gate signal supply wiring 31 through selection transistor 21. Selection transistor 21 acts as a switch that selects corresponding gate line 12. The plurality of gate lines 12 are electrically connected to one gate signal supply wiring 31. Specifically, for example, for 1920 gate lines 12, 1st, 31st, 61st, . . . , 1891st gate lines G1, G31, G61, . . . , G1891 are connected to gate signal supply wiring VG1 through each corresponding selection transistor 21, 2nd, 32nd, 62nd, . . . , 1892nd gate lines G2, G32, G62, . . . , G1892 are connected to gate signal supply wiring VG2 through each corresponding selection transistor 21, and similarly 30th, 60th, 90th, . . . , 1920th gate lines G30, G60, G90, . . . , G1920 are connected to gate signal supply wiring VG30 through each corresponding selection transistor 21. That is, in the example of FIG. 3, gate lines 12 are connected to identical gate signal supply wiring 31 every 30 gate lines 12. 64 gate lines 12 are electrically connected to one gate signal supply wiring 31. 30 adjacent gate lines 12 connected to gate signal supply wirings VG1 to VG30 constitute one group. For example, gate lines G1 to G30 constitute one group (1st group), gate lines G31 to G60 constitute one group (2nd group), and gate lines G1891 to G1920 constitute one group (64th group). In the example of FIG. 3, gate line 12 is constituted by 64 groups.

In 30 selection transistors 21 corresponding to one group, each control electrode (gate electrode) is connected to identical gate selection signal supply wiring 32 (selection signal supply wiring). For example, in the 1st group including gate lines G1 to G30, the control electrode of each of 30 selection transistors 21 connected to gate lines G1 to G30 is connected to gate selection signal supply wiring CLK1. In the 2nd group including gate lines G31 to G60, the control electrode of each of 30 selection transistors 21 connected to gate lines G31 to G60 is connected to gate selection signal supply wiring CLK2. Similarly, in the 64th group including gate lines G1891 to G1920, the control electrode of each of 30 selection transistors 21 connected to gate lines G1891 to G1920 is connected to gate selection signal supply wiring CLK64. That is, different gate selection signal supply wiring 32 is provided with respect to each group.

Operation of display panel 10 having the above configuration will be described. In this case, operation during image display will be described below.

First, gate driver IC 3 supplies a voltage (gate-on voltage) turning on selection transistor 21 to gate selection signal supply wiring CLK1. Therefore, selection transistors 21 connected to gate lines G1 to G30 of the 1st group are put into an on state. Then, gate driver IC 3 supplies a voltage (gate-on voltage) turning on thin film transistor 13 (see FIG. 2) of pixel 14 to gate signal supply wiring VG1. Therefore, 1st-column thin film transistors 13 connected to gate line G1 are put into the on state, and the data voltage output from source driver ICs 2a, 2b is supplied to 1st-column pixel electrodes 15 through data lines 11 connected to thin film transistors 13. Then, gate driver IC 3 supplies the gate-on voltage to gate signal supply wiring VG2 while supplying a voltage (gate-off voltage) for turning off thin film transistor 13 of pixel 14 to gate signal supply wiring VG1. Therefore, 1st-column thin film transistors 13 connected to gate line G1 are turned off, 2nd-column thin film transistors 13 connected to gate line G2 are put into the on state, and the data voltage output from source driver ICs 2a,2b is supplied to 2nd-column pixel electrodes 15 through data lines 11 connected to thin film transistors 13. Thus, in display panel 10, gate lines G1 to G30 of the 1st group are sequentially driven to supply the data voltage to corresponding pixel electrode 15.

Then, gate driver IC 3 supplies the gate-on voltage to gate selection signal supply wiring CLK2 while supplying a voltage (gate-off voltage) for turning off selection transistor 21 to gate selection signal supply wiring CLK1. Therefore, selection transistors 21 connected to gate lines G1 to G30 of the 1st group are turned off, and selection transistors 21 connected to gate lines G31 to G60 of the 2nd group are put into the on state. Then, gate driver IC 3 supplies the gate-on voltage to gate signal supply wiring VG1. Therefore, 31st-column thin film transistors 13 connected to gate line G31 are put into the on state, and the data voltage output from source driver ICs 2a, 2b is supplied to 31st-column pixel electrodes 15 through data lines 11 connected to thin film transistors 13. Then, gate driver IC 3 supplies the gate-on voltage to gate signal supply wiring VG2 while supplying the gate-off voltage to gate signal supply wiring VG1. Therefore, 31st-column thin film transistors 13 connected to gate line G31 are turned off, 32nd-column thin film transistors 13 connected to gate line G32 are put into the on state, and the data voltage output from source driver ICs 2a,2b is supplied to 32nd-column pixel electrodes 15 through data lines 11 connected to thin film transistors 13. Thus, in display panel 10, gate lines G31 to G60 of the 2nd group are sequentially driven to supply the data voltage to corresponding pixel electrode 15.

After that, in display panel 10, each group is sequentially driven to supply the data voltage to corresponding pixel electrode 15.

In the configuration of display panel 10 of the exemplary embodiment, the number of wirings connected to gate driver IC 3 is smaller than the number of gate lines 12, so that an area of the frame region can be reduced in the column direction compared with the configuration in which all the gate lines 12 are pulled around the gate driver IC.

Liquid crystal display device 100 of the exemplary embodiment includes a configuration for detecting a defect in display panel 10, for example, disconnection of data line 11 or gate line 12. Details of the configuration will be described below.

A plurality of inspection transistors 18, 19, 20 are provided in display panel 10. One inspection transistor 18 (third inspection transistor) is provided for each gate signal supply wiring 31, a control electrode (gate electrode) of inspection transistor 18 is connected to inspection control signal supply wiring 22, and one of conductive electrodes (source and drain electrodes) is connected to gate signal supply wiring 31. In inspection transistor 18 connected to gate signal supply wiring 31 (gate signal supply wirings VG1, . . . , VG29) electrically connected to odd-numbered gate line 12, the other of the conductive electrodes (source and drain electrodes) is connected to inspection gate signal supply wiring 25. In inspection transistor 18 connected to gate signal supply wiring 31 (gate signal supply wiring VG2, . . . , VG30) electrically connected to even-numbered gate line 12, the other of the conductive electrodes (source and drain electrodes) is connected to inspection gate signal supply wiring 26. Inspection gate signal supply wiring 25 is connected to gate signal input pad GO, and inspection gate signal supply wiring 26 is connected to gate signal input pad GE.

One inspection transistor 20 (second inspection transistor) is provided for each group including the plurality of gate lines 12 (in FIG. 3, 30 gate lines), the control electrode (gate electrode) of inspection transistor 20 is connected to inspection control signal supply wiring 22, and one of the conductive electrodes (source and drain electrodes) is connected to the control electrode of each selection transistor 21 included in the group. In inspection transistor 20 provided corresponding to the odd-numbered group (1st group, . . . , 63rd group), the other of the conductive electrodes (source and drain electrodes) is connected to inspection gate selection signal supply wiring 23 (inspection selection signal supply wiring). In inspection transistor 20 provided corresponding to the even-numbered group (2nd group, . . . , 64th group), the other of the conductive electrodes (source and drain electrodes) is connected to inspection gate selection signal supply wiring 24. Inspection gate selection signal supply wiring 23 is connected to selection signal input pad CLK1, and inspection gate selection signal supply wiring 24 is connected to selection signal input pad CLK2.

One inspection transistor 19 (first inspection transistor) is provided for each data line 11, and the control electrode (gate electrode) of inspection transistor 19 is connected to inspection control signal supply wiring 22. One of the conductive electrodes (source and drain electrodes) of inspection transistor 19 is connected to data line 11, and the other is connected to inspection data signal supply wiring 27. Inspection data signal supply wiring 27 includes a plurality (in this case, 6) of inspection data signal supply wirings 27 through which inspection data signals DR1, DG1, DB1, DR2, DG2, DB2 are supplied. Each inspection data signal supply wiring 27 is connected to data signal input pads DR1, DG1, DB1, DR2, DG2, DB2.

The control electrodes of all inspection transistors 18, 19, 20 are electrically connected to inspection control signal supply wiring 22, inspection control signal supply wiring 22 is connected to control signal input pad TR disposed in the peripheral portion of display panel 10. Inspection transistors 18, 19, 20 are simultaneously turned on and off when inspection control signal TR is supplied from the inspection device to inspection control signal supply wiring 22 through control signal input pad TR.

When inspection transistor 20 is turned on to supply selection signal CLK1 from the inspection device to inspection gate selection signal supply wiring 23 through selection signal input pad CLK1, each selection transistor 21 included in the odd-numbered group is put into the on state. When inspection gate signal GO is supplied from the inspection device to inspection gate signal supply wiring 25 through gate signal input pad GO, inspection gate signal GO is supplied to each odd-numbered gate line 12 included in the odd-numbered group through corresponding inspection transistor 18 and selection transistor 21. When inspection gate signal GE is supplied from the inspection device to inspection gate signal supply wiring 26 through gate signal input pad GE, inspection gate signal GE is supplied to each even-numbered gate line 12 included in the odd-numbered group through corresponding inspection transistor 18 and selection transistor 21.

On the other hand, when inspection transistor 20 is turned on to supply selection signal CLK2 from the inspection device to inspection gate selection signal supply wiring 24 through selection signal input pad CLK2, each selection transistor 21 included in the even-numbered group is put into the on state. When inspection gate signal GO is supplied from the inspection device to inspection gate signal supply wiring 25 through gate signal input pad GO, inspection gate signal GO is supplied to each odd-numbered gate line 12 included in the even-numbered group through corresponding inspection transistor 18 and selection transistor 21. When inspection gate signal GE is supplied from the inspection device to inspection gate signal supply wiring 26 through gate signal input pad GE, inspection gate signal GE is supplied to each even-numbered gate line 12 included in the even-numbered group through corresponding inspection transistor 18 and selection transistor 21.

When inspection transistor 19 is turned on to input R (red)-pixel inspection data signal DR1 from the inspection device to data signal input pad DR1, R-pixel inspection data signal DR1 is supplied to the plurality of corresponding data lines 11 through inspection data signal supply wiring 27 and inspection transistor 19, which are connected to data signal input pad DR1. When inspection transistor 19 is turned on to input G (green)-pixel inspection data signal DG1 from the inspection device to data signal input pad DG1, G-pixel inspection data signal DG1 is supplied to the plurality of corresponding data lines 11 through inspection data signal supply wiring 27 and inspection transistor 19, which are connected to the data signal input pad DG1. Similarly, each color-pixel inspection data signal is supplied to corresponding data line 11. In the example of FIG. 3, the plurality of data lines 11 are connected to identical inspection data signal supply wiring 27 every 6 data lines 11.

Each pad described above is included in inspection signal input pad 28, and inspection signal input pad 28 is disposed in the peripheral portion (in FIG. 3, the lower left side) of display panel 10. There is no limitation to a position of inspection signal input pad 28 and a number of inspection signal input pads 28.

In a case where display panel 10 is inspected, for example, in an inspection process included in a process of manufacturing display panel 10, the inspection device is connected to inspection signal input pad 28, and each inspection signal is supplied to each inspection signal supply wiring through inspection signal input pad 28. Specifically, the inspection device supplies inspection control signal TR controlling turn-on and -off of inspection transistors 18, 19, 20 to inspection control signal supply wiring 22, supplies selection signal CLK1 to inspection gate selection signal supply wiring 23, supplies selection signal CLK2 to inspection gate selection signal supply wiring 24, supplies inspection gate signal GO to inspection gate signal supply wiring 25, supplies inspection gate signal GE to inspection gate signal supply wiring 26, and supplies inspection data signals DR1, DG1, DB1, DR2, DG2, DB2 to the plurality of inspection data signal supply wirings 27, respectively.

When the inspection process is ended, the inspection device is separated from inspection signal input pad 28. When the inspection device is separated from display panel 10, inspection transistors 18, 19, 20 become an electrically floating state. For this reason, during normal use (during display operation), inspection transistors 18, 19, 20 are put into the on state due to the display operation, and a pixel potential fluctuates, which results in a risk of generating a display defect. In order to prevent the display defect, it is effective that inspection transistors 18, 19, 20 in the floating state are surely fixed to the off state during the display operation. At this point, liquid crystal display device 100 of the exemplary embodiment has the configuration in which inspection transistors 18, 19, 20 are surely fixed to the off state during the normal use (during the display operation).

Specifically, gate-off voltage transmission wiring 40 (off-voltage transmission wiring) that supplies a control signal (gate-off voltage) for turning off inspection transistors 18, 19, 20 is provided in display panel 10. One end of gate-off voltage transmission wiring 40 is electrically connected to terminal Voff provided in the peripheral portion (in FIG. 3, on the upper left side) of display panel 10, and the other end is electrically connected to inspection control signal supply wiring 22. As illustrated in FIG. 3, gate-off voltage transmission wiring 40 is disposed along an outermost edge side of display panel 10.

The gate-off voltage is always applied to terminal Voff during the display operation. Therefore, the gate-off voltage is always supplied to display panel 10, so that inspection transistors 18, 19, 20 can be fixed to the off state during the display operation. Accordingly, the display defect caused by the turn-on of inspection transistors 18, 19, 20 during the display operation can be prevented.

An example of an inspection method in liquid crystal display device 100 will be briefly described below.

First, the inspection device is connected to inspection signal input pad 28 of display panel 10. Then the inspection device inputs inspection control signal TR (gate-on voltage)

to inspection control signal supply wiring 22 through control signal input pad TR. Therefore, inspection transistors 18, 19, 20 are put into the on-state. Then the inspection device supplies selection signal CLK1 (gate-on voltage) to inspection gate selection signal supply wiring 23. Therefore, each selection transistor 21, which is connected to inspection gate selection signal supply wiring 23 and included in the odd-numbered group, is put into the on state. Then the inspection device supplies inspection gate signal GO to inspection gate signal supply wiring 25. Therefore, the gate-on voltage is supplied to each odd-numbered gate line 12 included in the odd-numbered group. Then the inspection device supplies inspection data signals DR1, DG1, DB1, DR2, DG2, DB2 to corresponding pixel electrodes 15 through thin film transistors 13 connected to the odd-numbered gate lines 12 included in the odd-numbered group. Common voltage Vcom is supplied to common electrode 16. Therefore, the defect of the corresponding gate line or data line can be detected by inspecting the display state of corresponding pixel 14, in this case, odd-numbered column pixel 14 included in the odd-numbered group. The inspection data signal may be supplied in different timing depending on an R color, a G color, and a B color.

Then the inspection device supplies inspection gate signal GE to inspection gate signal supply wiring 26. Therefore, the gate-on voltage is supplied to each even-numbered gate line 12 included in the odd-numbered group. Then the inspection device supplies inspection data signals DR1, DG1, DB1, DR2, DG2, DB2 to corresponding pixel electrodes 15 through thin film transistors 13 connected to the even-numbered gate lines 12 included in the odd-numbered group. Common voltage Vcom is supplied to common electrode 16. Therefore, the defect of the corresponding gate line or data line can be detected by inspecting the display state of corresponding pixel 14, in this case, even-numbered column pixel 14 included in the odd-numbered group.

Then the inspection device supplies selection signal CLK2 (gate-on voltage) to inspection gate selection signal supply wiring 24 while supplying selection signal CLK1 (gate-off voltage) to inspection gate selection signal supply wiring 23. Therefore, each selection transistor 21, which is connected to inspection gate selection signal supply wiring 23 and included in the odd-numbered group, is turned off, and each selection transistor 21, which is connected to inspection gate selection signal supply wiring 24 and included in the even-numbered group, is put into the on state. Then the inspection device supplies inspection gate signal GO to inspection gate signal supply wiring 25. Therefore, the gate-on voltage is supplied to each odd-numbered gate line 12 included in the even-numbered group. Then the inspection device supplies inspection data signals DR1, DG1, DB1, DR2, DG2, DB2 to corresponding pixel electrodes 15 through thin film transistors 13 connected to the odd-numbered gate lines 12 included in the even-numbered group. Common voltage Vcom is supplied to common electrode 16. Therefore, the defect of the corresponding gate line or data line can be detected by inspecting the display state of corresponding pixel 14, in this case, odd-numbered column pixel 14 included in the even-numbered group.

Then the inspection device supplies inspection gate signal GE to inspection gate signal supply wiring 26. Therefore, the gate-on voltage is supplied to each even-numbered gate line 12 included in the even-numbered group. Then the inspection device supplies inspection data signals DR1, DG1, DB1, DR2, DG2, DB2 to corresponding pixel electrodes 15 through thin film transistors 13 connected to the even-numbered gate lines 12 included in the even-numbered group. Common voltage Vcom is supplied to common electrode 16. Therefore, the defect of the corresponding gate line or data line can be detected by inspecting the display state of corresponding pixel 14, in this case, even-numbered column pixel 14 included in the even-numbered group.

Thus, the display panel 10 is inspected in the inspection process. When the inspection process is ended, the inspection device is separated from inspection signal input pad 28 of display panel 10. The method for inspecting display panel 10 is not limited to the above method, but any known method may be adopted.

Figure 4:
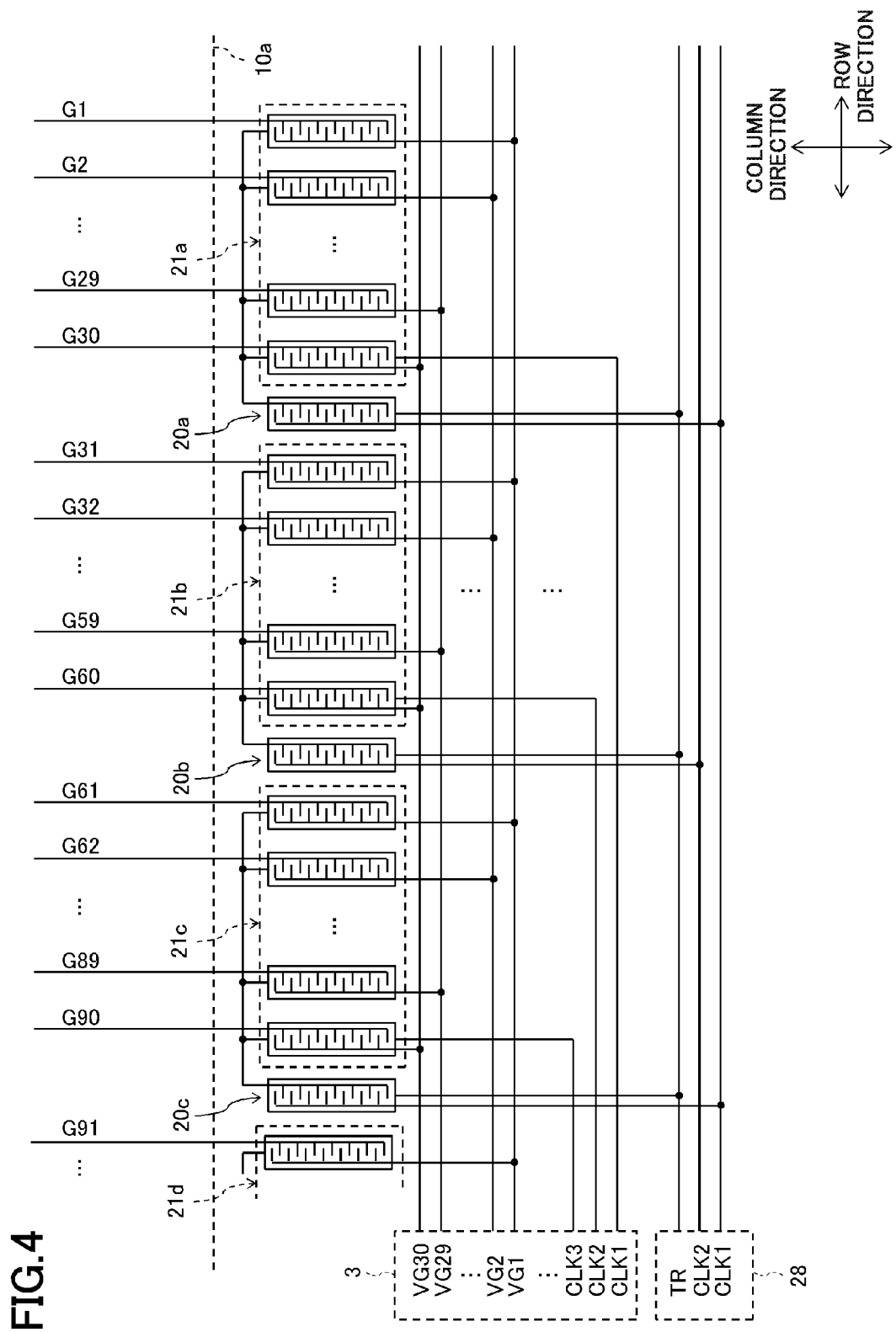
FIG. 4 is a plan view illustrating a disposition of inspection transistors and selection transistors.

FIG. 4 is a plan view illustrating a disposition of inspection transistors 20 and selection transistors 21. FIG. 4 illustrates inspection transistor 20a and selection transistors 21a corresponding to the 1st group, inspection transistor 20b and selection transistors 21b corresponding to the 2nd group, and inspection transistor 20c and selection transistors 21c corresponding to the 3rd group. Inspection transistors 20 and selection transistors 21 are arranged in the row direction. Each inspection transistor 20 is disposed between two groups adjacent to each other in the row direction. For example, inspection transistor 20a is disposed between 1st-group selection transistors 21a connected to 1st-group gate lines G1 to G30 and 2nd-group selection transistors 21b connected to 2nd-group gate lines G31 to G60. Inspection transistor 20b is disposed between 2nd-group selection transistors 21b connected to 2nd-group gate lines G31 to G60 and 3rd-group selection transistors 21c connected to the 3rd-group gate lines G61 to G90.

Figure 5:
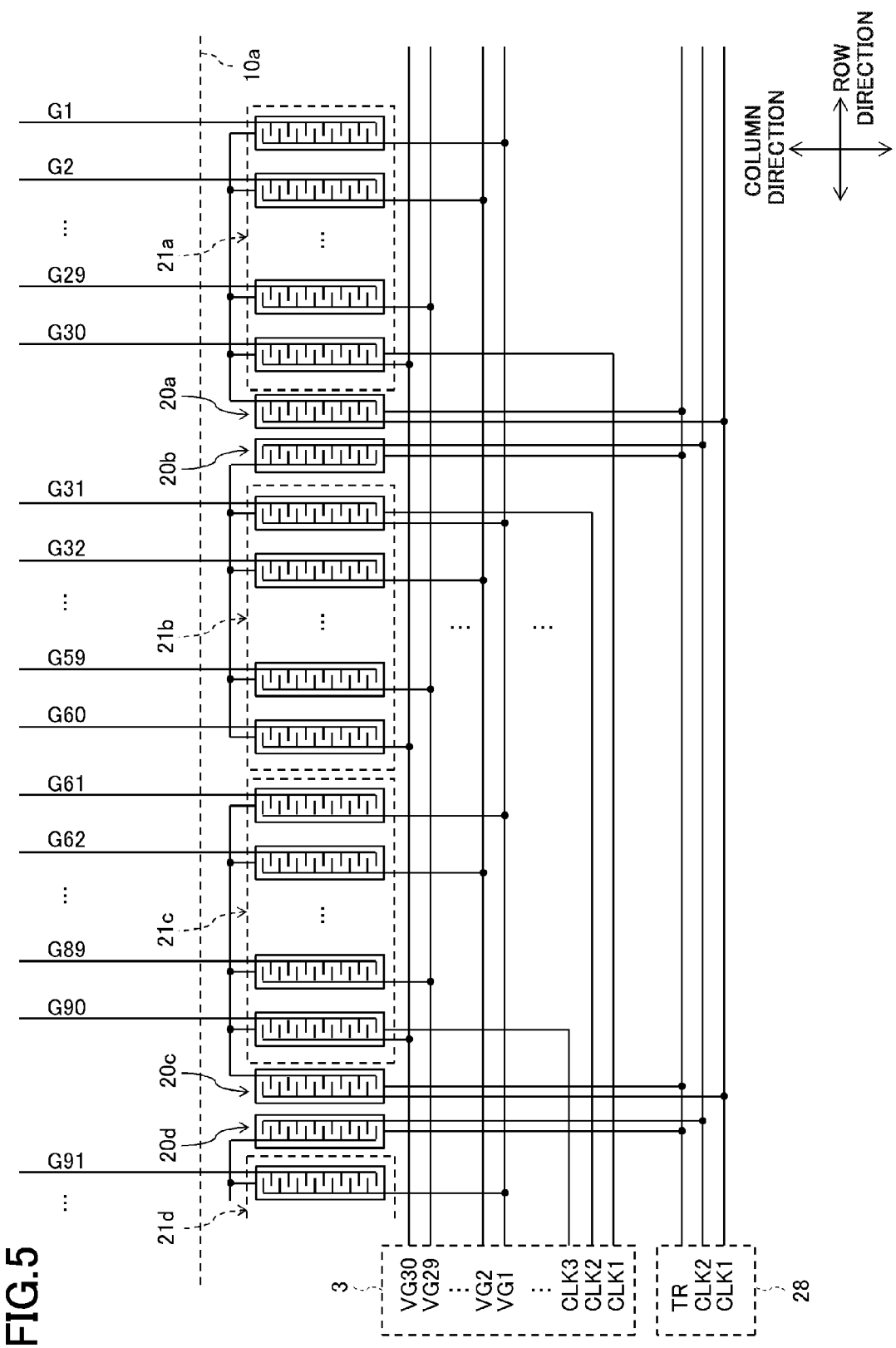
FIG. 5 is a plan view illustrating another disposition of inspection transistors and selection transistors.

FIG. 5 is a plan view illustrating another disposition of inspection transistors 20 and selection transistors 21. Referring to FIG. 5, two inspection transistors 20 are arranged side by side in the row direction. Two inspection transistors 20 adjacent to each other are arranged between two groups adjacent to each other in the row direction. For example, inspection transistors 20a, 20b are arranged adjacent to each other in the row direction. Inspection transistors 20a, 20b are also arranged between selection transistors 21a of the 1st group and selection transistors 21b of the 2nd group. In this case, inspection transistors 20 are not arranged between selection transistors 21b of the 2nd group and selection transistors 21c of the 3rd group.

In FIGS. 4 and 5, inspection transistor 20 and selection transistor 21 have a rectangular shape in planar view, and are disposed such that a long side extends in the column direction and such that a short side extends in the row direction. Inspection transistors 20 are disposed between two selection transistors 21 adjacent to each other. In the configurations of FIGS. 4 and 5, inspection transistor 20 and selection transistor 21 are efficiently arranged in frame region 10b, so that the area of frame region 10b can be reduced. Various inspection wirings are efficiently disposed, so that contact between the inspection wirings can be prevented.

Figure 6:
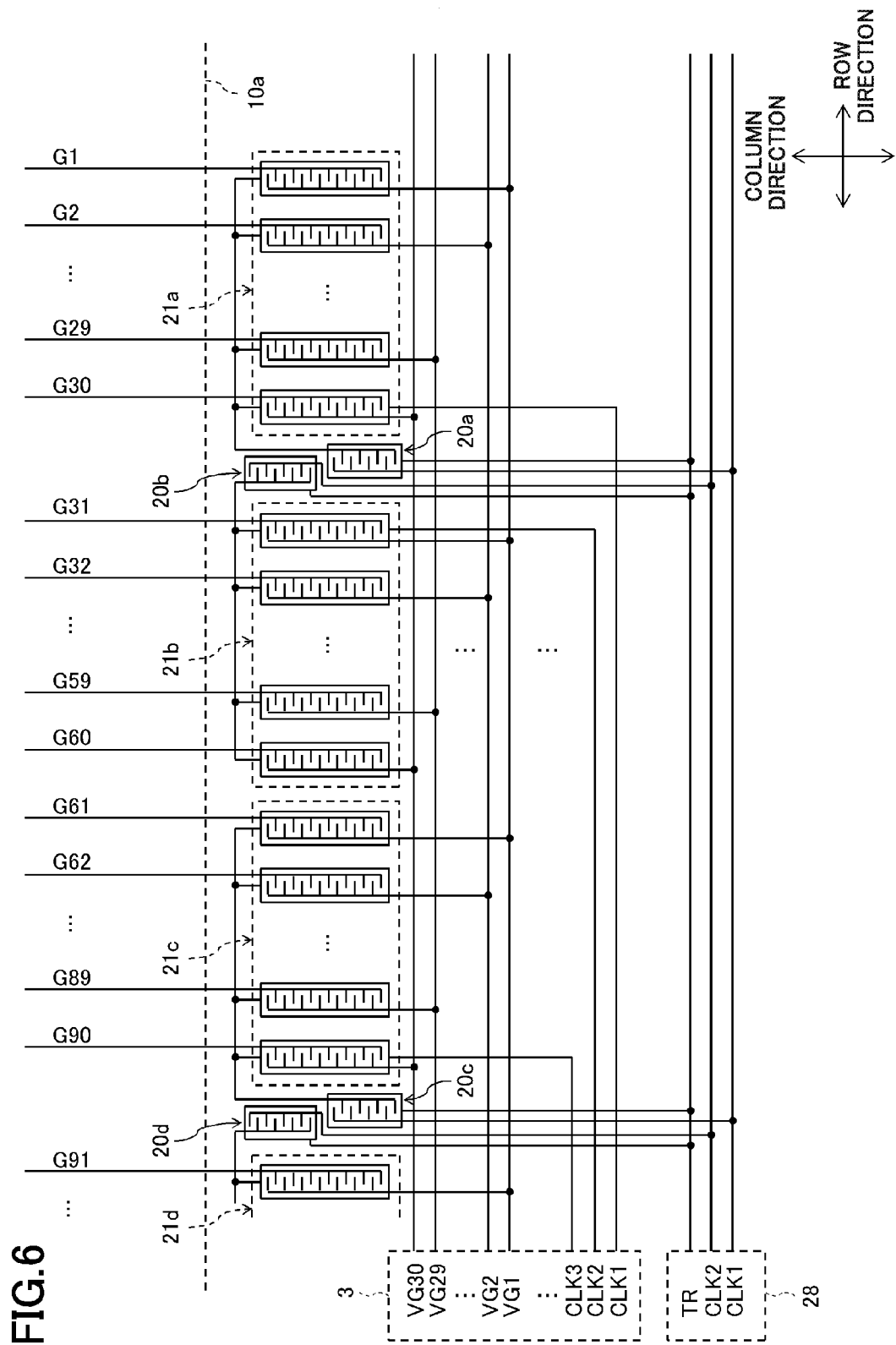
FIG. 6 is a plan view illustrating another disposition of inspection transistors and selection transistors.

FIG. 6 is a plan view illustrating still another disposition of inspection transistors 20 and selection transistors 21. Referring to FIG. 6, two inspection transistors 20 adjacent to each other are arranged in the column direction. Two inspection transistors 20 adjacent to each other are arranged between two groups adjacent to each other in the row direction. For example, inspection transistors 20a, 20b are arranged adjacent to each other in the column direction. Inspection transistors 20a, 20b are also arranged between selection transistors 21a of the 1st group and selection transistors 21b of the 2nd group. In this case, inspection transistors 20 are not arranged between selection transistors 21b of the 2nd group and selection transistors 21c of the 3rd group.

In the configuration of FIG. 6, inspection transistor 20 and selection transistor 21 also have the rectangular shape in planar view, and are disposed such that the long side extends in the column direction and such that the short side extends in the row direction. In the configuration of FIG. 6, two inspection transistors 20 are put together in the column direction, so that the area of frame region 10b can further be reduced.

Figure 7:
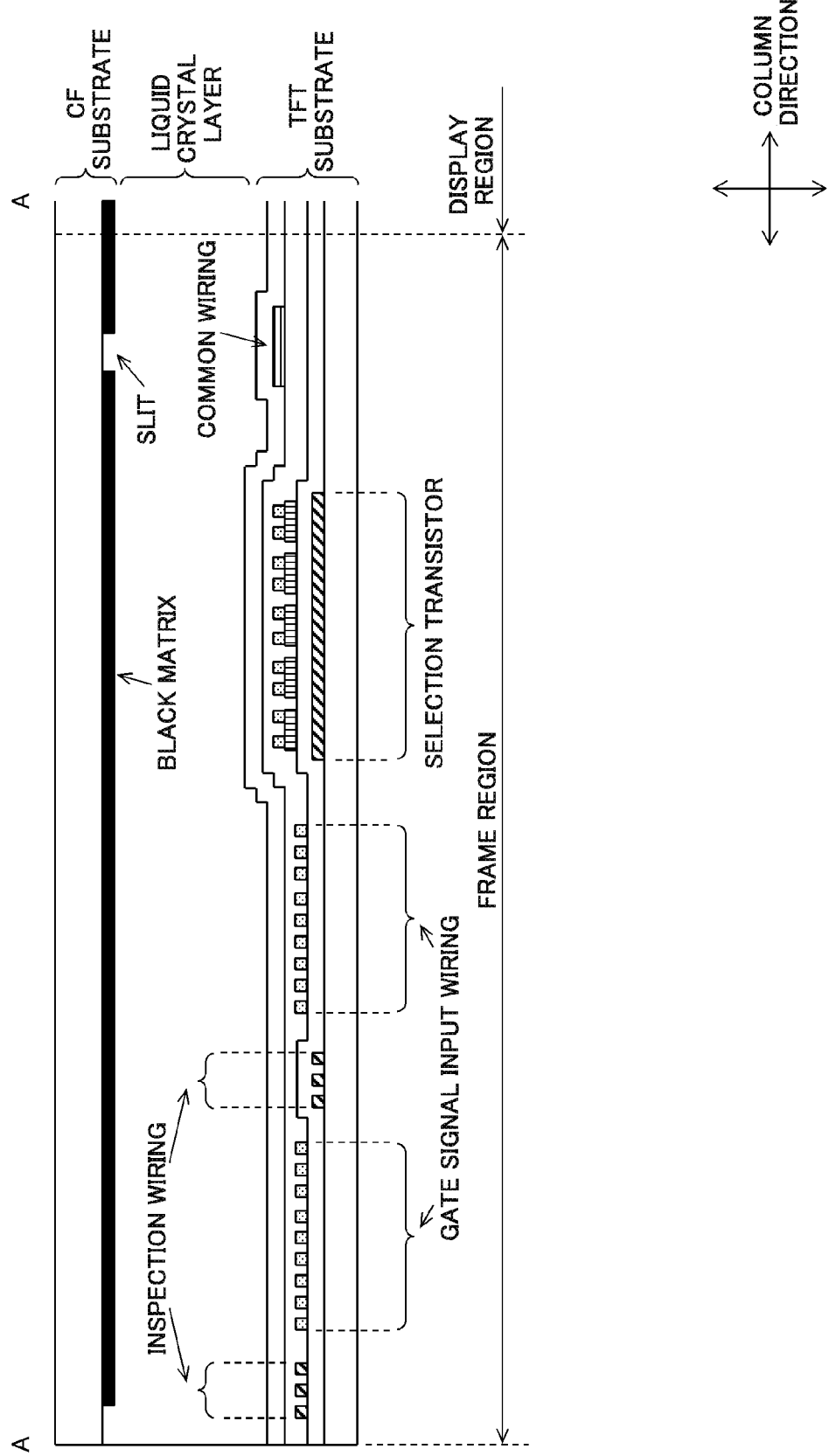
FIG. 7 is a sectional view taken along line A-A in FIG. 3.

FIG. 7 is a sectional view taken along line A-A in FIG. 3. In FIG. 7, the inspection wiring includes inspection control signal supply wiring 22, inspection gate selection signal supply wirings 23, 24, inspection gate signal supply wirings 25, 26, and inspection data signal supply wiring 27, to which various inspection signals output from the inspection device are input. A gate signal input wiring includes gate signal supply wiring 31 and gate selection signal supply wiring 32, to which various display operation signals output from the gate driver IC are input. In FIG. 7, inspection control signal supply wiring 22 and inspection gate selection signal supply wirings 23, 24 are disposed in a gate layer in a region between the gate signal input wirings.

As illustrated in FIG. 7, in a black matrix of the CF substrate, a slit is formed in a part of frame region 10b. Therefore, a charge generated in selection transistor 21 can be prevented from propagating to display region 10a.

FIG. 8 is a plan view illustrating a specific configuration of selection transistor 21. As illustrated in FIG. 8, preferably a semiconductor layer constituting a channel portion of selection transistor 21 is divided into a plurality of pieces in the column direction. The semiconductor layer is made of amorphous silicon (a-Si). In the configuration of FIG. 8, a heat radiation effect that dissipates self-heating of the transistor can be enhanced compared with the transistor in which the semiconductor layer is integrally formed. Inspection transistor 20 can adopt the configuration identical to that in FIG. 8.

In display panel 10, as illustrated in FIG. 3, inspection transistor 20 and selection transistor 21 are disposed one end side of gate line 12. However, display panel 10 of the exemplary embodiment is not limited to the configuration in FIG. 3, but inspection transistor 20 and selection transistor 21 may be disposed on both ends of gate line 12. That is, in the configuration of FIG. 3, gate driver IC 3 and inspection signal input pad 28 may be provided in frame region 10b on the upper side of display region 10a.

While there have been described what are at present considered to be certain embodiments of the application, it will be understood that various modifications may be made thereto, and it is intended that the appended claims cover all such modifications as fall within the true spirit and scope of the invention.

What is claimed is:

1. A display panel comprising:
a plurality of data lines extending in a row direction;
a plurality of gate lines extending in a column direction, each of the plurality of gate lines adjacent in the row direction being grouped into one group;
a plurality of selection transistors connected to ends of the plurality of gate lines, respectively;
a plurality of selection signal supply wirings provided in each group, each of the plurality of selection signal supply wirings supplying a control signal for turning on or off the selection transistor to a control electrode of each of the plurality of the selection transistors corresponding to the group;
a plurality of gate signal supply wirings that sequentially supply a gate signal to the plurality of gate lines included in the group;
a plurality of first inspection transistors connected to the plurality of data lines, respectively;
a plurality of second inspection transistors provided in each group, a first conductive electrode of each of the plurality of second inspection transistors being connected to the control electrode of each of the plurality of the selection transistors corresponding to the group;
a plurality of inspection selection signal supply wirings connected to a second conductive electrode of each of the plurality of second inspection transistors, each of the plurality of inspection selection signal supply wirings supplying a control signal for turning on or off the second inspection transistor; and
an inspection control signal supply wiring connected to a control electrode of each of the plurality of first inspection transistors and a control electrode of each of the plurality of second inspection transistors, the inspection control signal supply wiring supplying a control signal for turning on or off the first and second inspection transistors,
wherein the plurality of selection transistors and the plurality of second inspection transistors are arranged in the row direction on one side in a display region.

2. The display panel according to claim 1, wherein each of the plurality of second inspection transistors is disposed between the two selection transistors, which are adjacent to each other in the row direction and provided corresponding to the two groups adjacent to each other in the row direction.

3. The display panel according to claim 1, wherein the adjacent second inspection transistors are arranged in the row direction, and disposed between the two selection transistors, which are adjacent to each other in the row direction and provided corresponding to the two groups adjacent to each other in the row direction.

4. The display panel according to claim 1, wherein the adjacent second inspection transistors are arranged in the column direction, and disposed between the two selection transistors, which are adjacent to each other in the row direction and provided corresponding to the two groups adjacent to each other in the row direction.

5. The display panel according to claim 1, wherein a semiconductor layer constituting a channel portion of each of the plurality of selection transistors and the plurality of second inspection transistors is divided into a plurality of pieces in the column direction.

6. The display panel according to claim 1, further comprising:
a plurality of inspection gate signal supply wirings that supply an inspection gate signal to the plurality of gate lines; and
a plurality of third inspection transistors, in each of which a first conductive electrode is connected to the inspection gate signal supply wiring, a second conductive electrode is electrically connected to the selection transistor, and a control electrode is connected to the inspection control signal supply wiring.

7. The display panel according to claim 1, wherein the plurality of inspection selection signal supply wirings include a first inspection selection signal supply wiring and a second inspection selection signal supply wiring, the first inspection selection signal supply wiring is electrically connected to the second conductive electrode of the second inspection transistor provided corresponding to an odd-numbered group, and the second inspection selection signal supply wiring is electrically connected to the second conductive electrode of the second inspection transistor provided corresponding to an even-numbered group.

8. The display panel according to claim 6, wherein the plurality of inspection gate signal supply wirings include a first inspection gate signal supply wiring and a second inspection gate signal supply wiring, the first inspection gate signal supply wiring is electrically connected to a plurality of odd-numbered gate lines, and the second inspection gate signal supply wiring is electrically connected to a plurality of even-numbered gate lines.

9. The display panel according to claim 1, wherein the plurality of gate lines are electrically connected to each of the gate signal supply wirings, and the plurality of gate lines are electrically connected to the gate signal supply wirings different from each other in each group.

* * * * *